(12) United States Patent
Lee et al.

(10) Patent No.: US 7,826,230 B2
(45) Date of Patent: Nov. 2, 2010

(54) SERVER ENCLOSURE WITH TRANSFER CARD MODULE

(75) Inventors: Sheng-Hung Lee, Taipei Hsien (TW); Che-Jui Chang, Taipei Hsien (TW); Si-Lek Lao, Shenzhen (TW); Li-Ping Chen, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 430 days.

(21) Appl. No.: 12/110,315

(22) Filed: Apr. 26, 2008

(65) Prior Publication Data

US 2009/0244861 A1 Oct. 1, 2009

(30) Foreign Application Priority Data

Mar. 27, 2008 (CN) .................. 2008 2 0300456 U

(51) Int. Cl.
*H05K 5/00* (2006.01)
(52) U.S. Cl. .................. 361/759; 361/807; 361/810
(58) Field of Classification Search .................. 361/600, 361/679, 724–731, 736, 748, 752, 759, 784, 361/796, 798, 800–802, 807–810; 312/223.1, 312/223.2; 211/41.17, 41.1, 13.1; 439/55, 439/59, 62, 374
See application file for complete search history.

(56) References Cited

U.S. PATENT DOCUMENTS

| | | | | |
|---|---|---|---|---|
| 6,244,953 | B1* | 6/2001 | Dugan et al. | 454/184 |
| 6,875,052 | B1* | 4/2005 | Lo et al. | 439/564 |
| 7,002,796 | B2* | 2/2006 | Lao et al. | 361/695 |
| 7,649,751 | B2* | 1/2010 | Nguyen et al. | 361/802 |
| 2009/0190316 | A1* | 7/2009 | Wu et al. | 361/753 |
| 2010/0117497 | A1* | 5/2010 | Wu et al. | 312/223.2 |

* cited by examiner

*Primary Examiner*—Hung S Bui
(74) *Attorney, Agent, or Firm*—Frank R. Niranjan

(57) ABSTRACT

The invention relates to a server enclosure with a transfer card module with a chassis having a side, a mounting bracket attached to the side of the chassis, and a transfer card secured to the mounting bracket. The mounting bracket includes a first sidewall and an opposite second sidewall. A first receiving slot is defined between the first sidewall and the second sidewall. The transfer card includes a printed circuit board. A first connector and a second connector are disposed on one side of the printed circuit board. The first connector is located between the printed circuit board and the first sidewall of the mounting bracket. The second connector is proximate to the mounting bracket and aligned with the first receiving slot of the mounting bracket.

17 Claims, 5 Drawing Sheets

SERVER ENCLOSURE WITH TRANSFER CARD MODULE

BACKGROUND

1. Technical Field

The present invention relates to server enclosures, more particularly to a server enclosure including a transfer card module.

2. General Background

In the information industry, blade servers have been widely adopted by information enterprises and providers because of the advantages of their thin and flat configuration, being convenient to manage, ease of expansion etc. In general, a plurality of connector ports is installed in the blade server enclosure by screws, for being connected to corresponding peripheral devices to expand functions of the server. However, using screws is time-consuming, and the screws are tiny and easily lost during manipulation. Furthermore, because of the thin and flat configuration of the blade server enclosure, space inside the blade servers is limited. Therefore, it is difficult to screw a plurality of connectors in the server enclosures.

What is needed, therefore, is a server enclosure adapted for rapidly accommodating a plurality of connector ports and capable of saving space therein.

SUMMARY

The invention relates to a server enclosure with a transfer card module with a chassis having a side, a mounting bracket attached to the side of the chassis, and a transfer card secured to the mounting bracket. The mounting bracket includes a first sidewall and an opposite second sidewall. A first receiving slot is defined between the first sidewall and the second sidewall. The transfer card includes a printed circuit board. A first connector and a second connector are disposed on one side of the printed circuit board. The first connector is located between the printed circuit board and the first sidewall of the mounting bracket. The second connector is proximate to the mounting bracket and aligned with the first receiving slot of the mounting bracket.

Other advantages and novel features of the present invention will become more apparent from the following detailed description of embodiment when taken in conjunction with the accompanying drawings, in which:

DETAILED DESCRIPTION OF THE EMBODIMENTS

Figure 1:
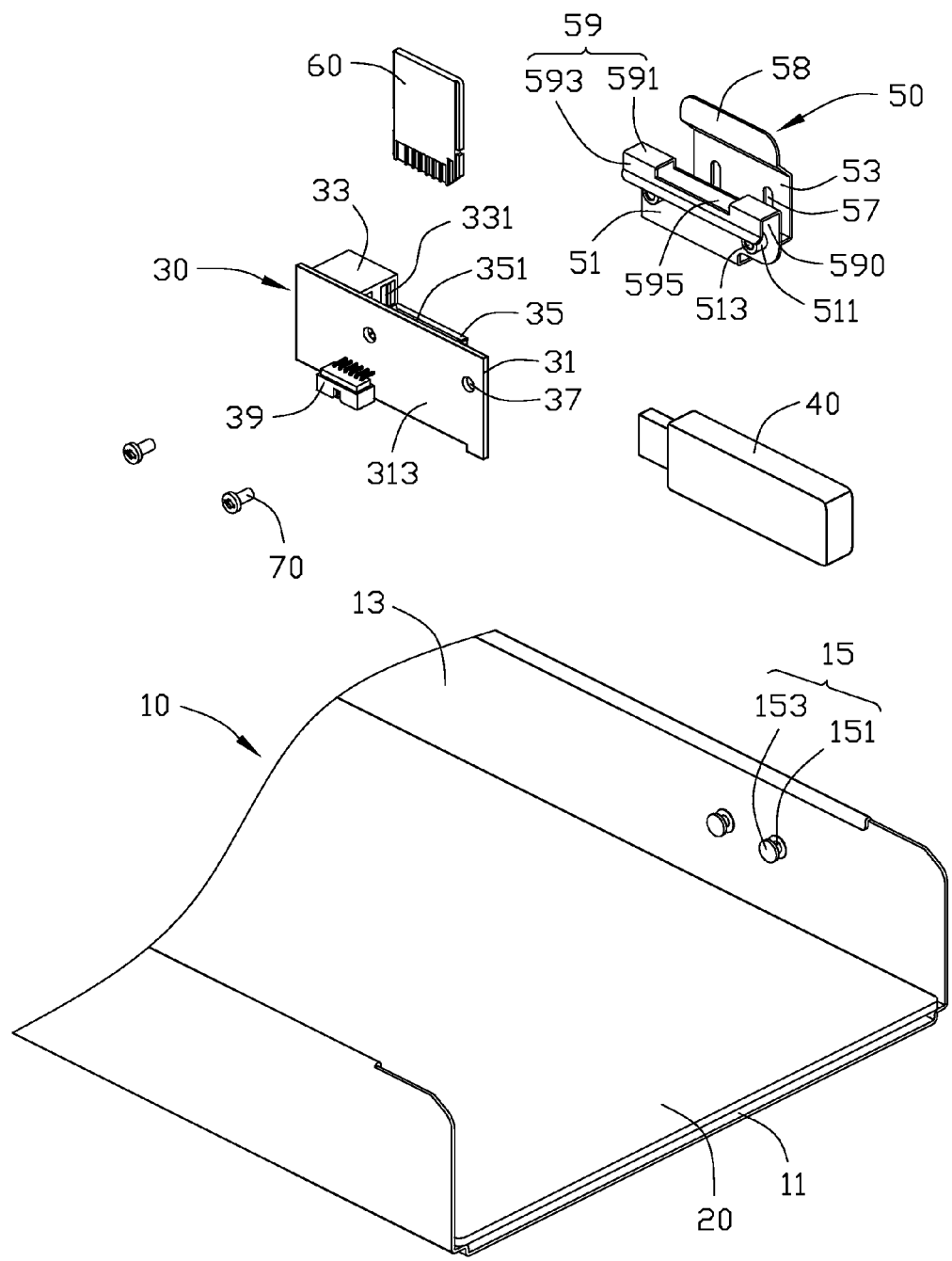
FIG. 1 is an exploded, isometric view of a server enclosure in accordance with an embodiment of the present invention, together with a first and a second periphery devices, the server enclosure includes a chassis, a mounting bracket, and a transfer card.
Figure 2:
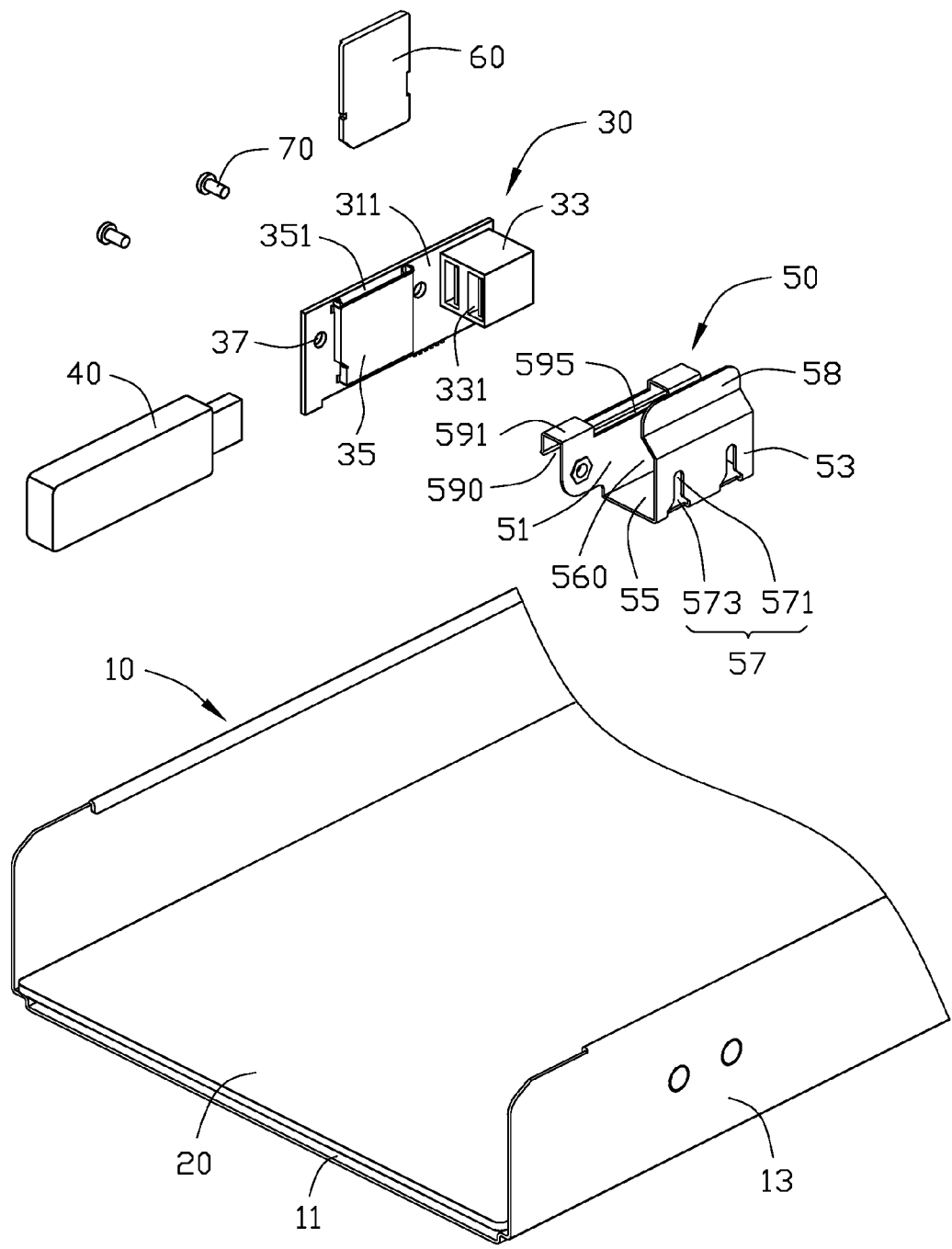
FIG. 2 is similar to FIG. 1, but viewed from another aspect.

Referring to FIG. 1, a server enclosure with a transfer card module in accordance with the embodiment includes a chassis 10, a transfer card 30, and a mounting bracket 50. The transfer card 30 is secured to the mounting bracket 50, thereby forming a transfer card module. The transfer module is mounted in the chassis 10.

The chassis 10 includes a bottom 11 and a side 13 perpendicular to the bottom 11. A motherboard 20 is mounted on the bottom 11. Two positioning posts 15 are formed on an inner portion of the side 13. Each positioning post 15 has a narrow sliding portion 151 protruding from the side 13 and a wide blocking portioning 153 formed at a distal end of the sliding portion 151.

The transfer card 30 includes a rectangular printed circuit board (PCB) 31. A first connector 33, such as a universal serial bus (USB) connector, and a second connector 35, such as a secure digital (SD) card connector, are mounted on one side 311 of the PCB 31. The thickness of the SD card connector 35 is much thinner than that of the USB connector 33. A USB port 331 is defined in one side of the USB connector 33 towards the SD card connector 35 and is offset from the SD card connector 35. A USB device 40 can be inserted into the USB port 331 from a first direction substantially parallel to the bottom 11 of the chassis 10 to form an electrical connection therebetween. An SD card port 351 is allocated on top of the SD card connector 35 and capable of having an SD card 60 being inserted therein from a second direction substantially perpendicular to the bottom 11 of the chassis 10 to form an electrical connection therebetween. Securing holes 37 are defined in the PCB 31 on either side of the SD card connector 35. A third connector 39 is mounted on a bottom of the other side 313 of the PCB 31, for electrically connecting the transfer card 30 to the motherboard 20.

The mounting bracket 50 includes a first sidewall 51, a second sidewall 53 opposite to the first sidewall 51, and a bottom wall 55 connected to the first sidewall 51 and the second sidewall 53. Two securing posts 511 corresponding to the securing holes 37 in the transfer card 30 protrude from the first sidewall 51. Each securing post 511 defines a securing hole 513. Fastening members 70 extend through the securing holes 37 in the transfer card 30 and the securing hole 513 to secure the transfer card 30 to the mounting bracket 50. An L-shaped bent plate 59 is extended outward from a top edge of the first sidewall 51. The bent plate 59 has a horizontal wall 591 substantially parallel to the motherboard 20 and a vertical wall 593 substantially parallel to the first sidewall 51. A first receiving slot 560 is defined between the first and second sidewalls 51 and 53. A second receiving slot 590 is defined between the vertical wall 593 and the first sidewall 51. A middle portion of the bent plate 59 defines an opening 595 therein. Two substantially converse Y-shaped positioning slots 57 are spacedly defined in the second sidewall 53 corresponding to the positioning posts 15 on the sidewall 13 of the chassis 10. Each positioning slot 57 has a narrow securing portion 571 and a wide guiding portion 573 in communication with the securing portion 571. A handle 58 extends upward from a top edge of the second sidewall 53.

Figure 3:
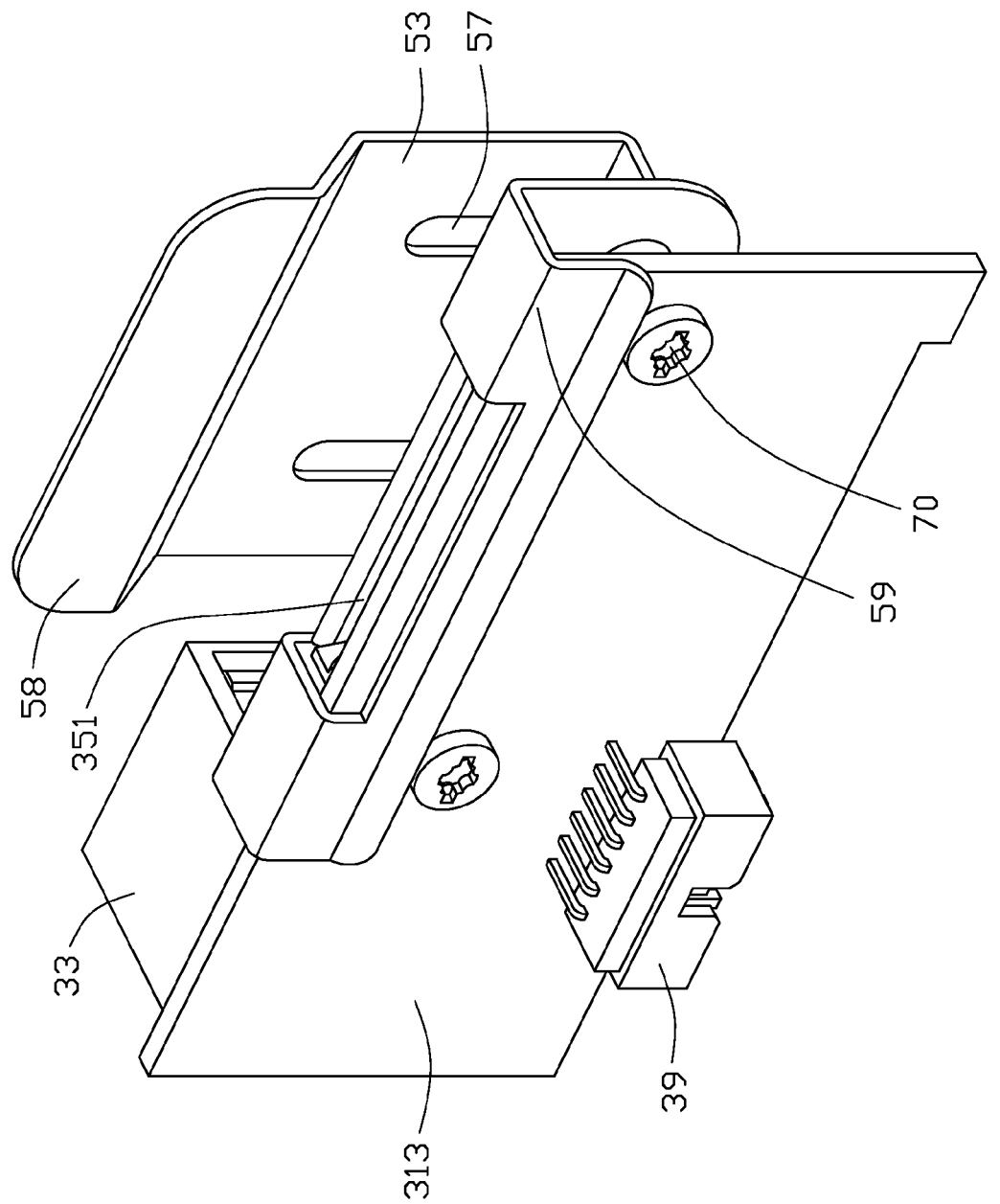
FIG. 3 is an assembled, isometric view of the mounting bracket and the transfer card of FIG. 1.
Figure 4:
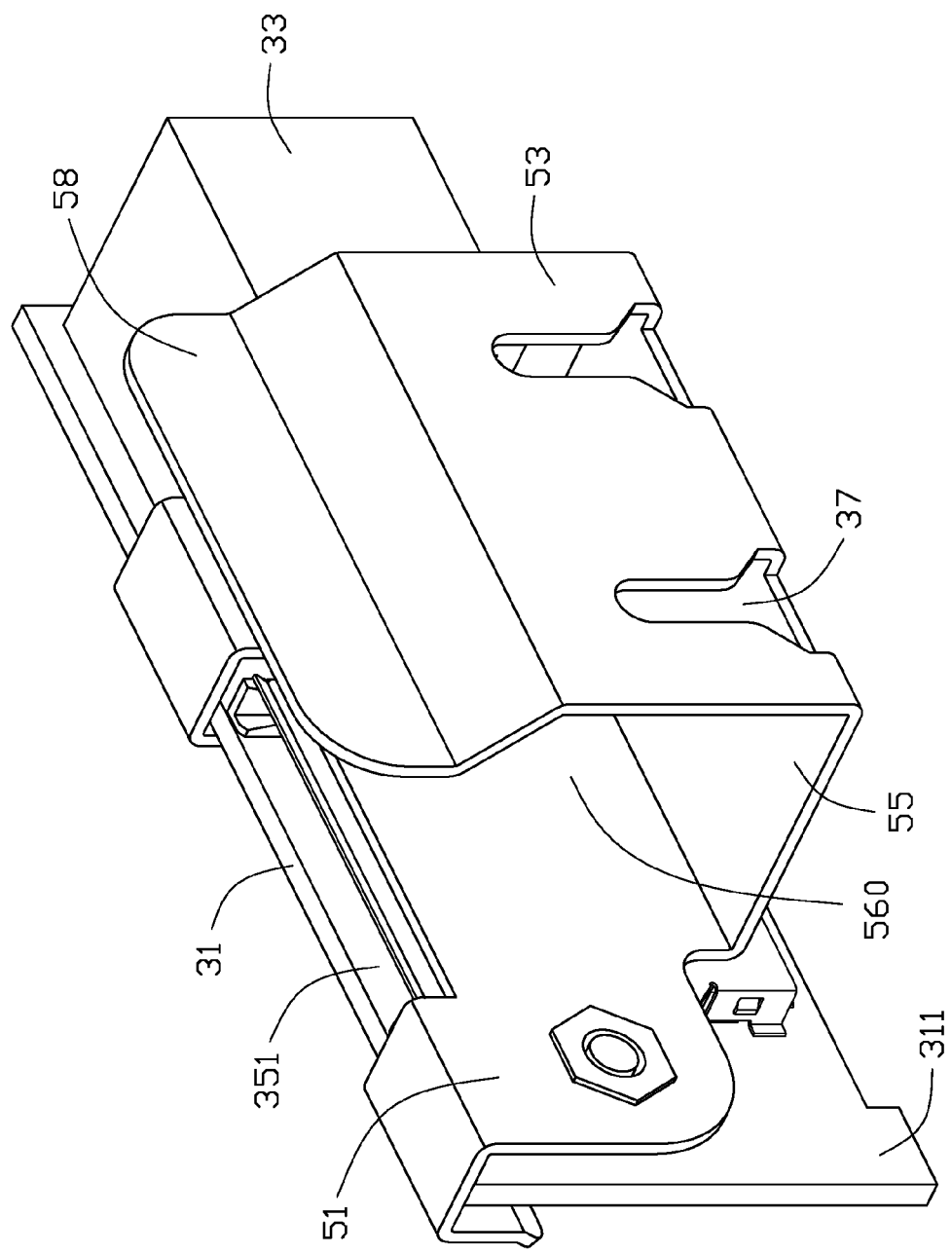
FIG. 4 is similar to FIG. 3, but viewed from another aspect.
Figure 5:
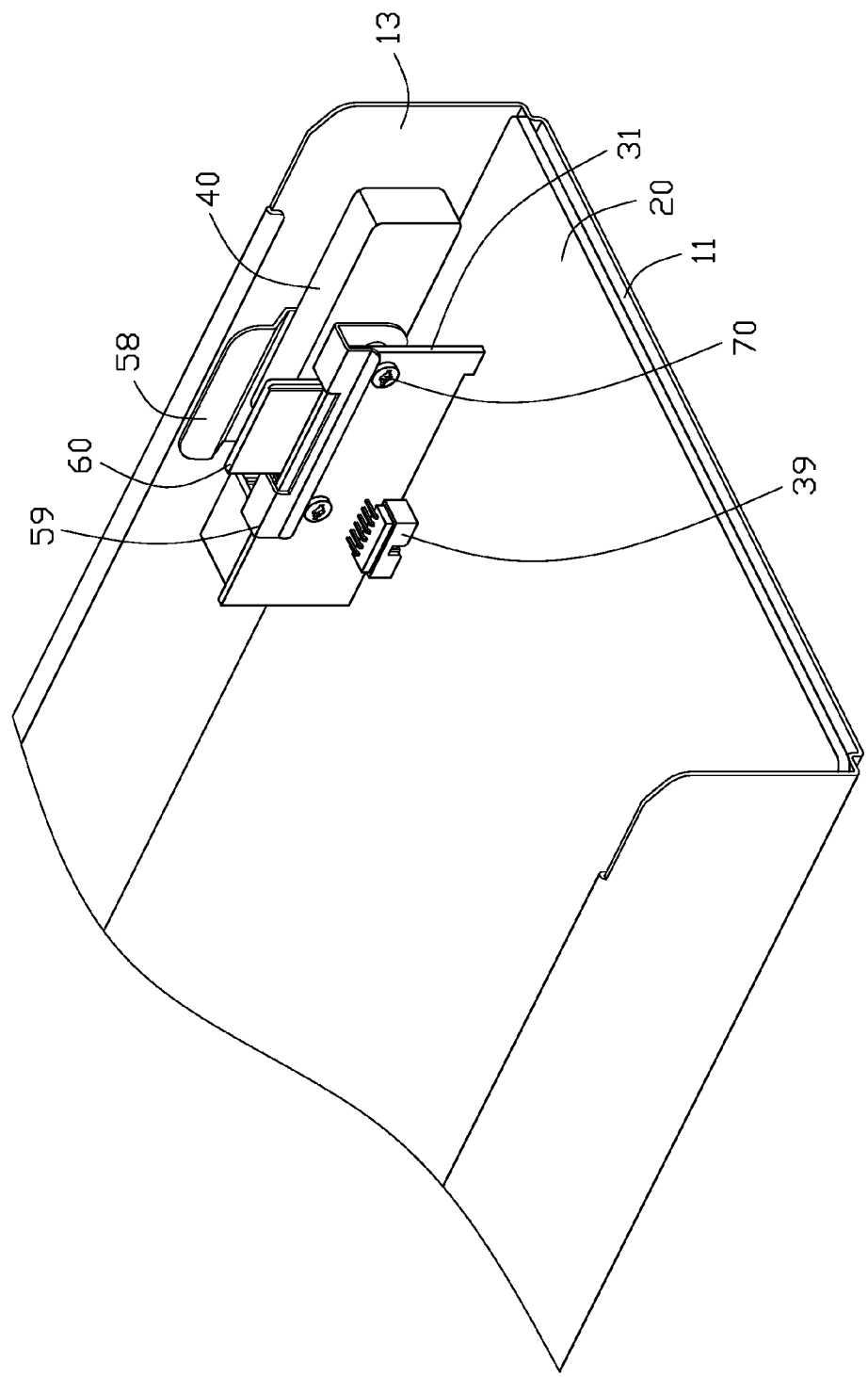
FIG. 5 is an assembled, isometric view of FIG. 1.

Referring to FIGS. 3 to 5, in assembly, one end of the transfer card 30 with the SD card connector 35 is inserted in the second receiving slot 590 of the mounting bracket 50, and the SD card connector 35 is sandwiched between the first sidewall 51 and the PCB 31 of the transfer card 30. The horizontal wall 591 of the bent plate 59 abuts on a top of the PCB 31. The SD card port 351 in the SD card connector 35 is aligned with the opening 595 and exposed outside therefrom. Two fastening members 70 respectively extend through the securing holes 37 and 513 in the transfer card 30 and the positioning posts 511 of the mounting bracket 50 to secure the transfer card 30 to the mounting bracket 50, thereby forming a transfer card module. The mounting bracket 50 is proximate to the USB connector 33. The USB port 331 of the USB connector 33 is aligned with the first receiving slot 560. Then, the mounting bracket 50 is moved along the sidewall 13 of the chassis 10, and the positioning slots 57 of the mounting bracket 50 are aligned with the corresponding positioning posts 15 on the chassis 10. The blocking portions 153 of the positioning posts 15 extend through the guiding portions 573 of the positioning slots 57. The transfer card module is moved further down towards the motherboard 20. The third connector 39 is attached to the motherboard 20. Meanwhile, the sliding portions 151 of the positioning posts 15 are tightly engaged in the securing portion 571. The second sidewall 53 of the mounting bracket 50 is sandwiched between the blocking portions 153 of the positioning posts 15 and the sidewall 13 of the chassis 10. Thus, the mounting bracket 50 is secured to the chassis 10. In use, the USB device 40 is inserted in the USB port 331 of the USB connector 33 in a first direction parallel to the motherboard 20 and is received in the first receiving slot 560. The SD card 60 is inserted into the SD card port 351 through the opening 595 in the bent plate 59 of the mounting bracket 50.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A server enclosure with a transfer card module, comprising:
   a chassis having a bottom and a side perpendicular thereto;
   a mounting bracket attached to the side of the chassis, the mounting bracket having a first sidewall and an opposite second sidewall, a first receiving slot defined between the first sidewall and the second sidewall; and
   a transfer card having a printed circuit board secured to the first sidewall of the mounting bracket, a first connector and a second connector disposed on one side of the printed circuit board, the first connector located between the printed circuit board and the first sidewall of the mounting bracket, the second connector proximate to the mounting bracket and aligned with the first receiving slot of the mounting bracket.

2. The server enclosure as described in claim 1, wherein a first port is defined in one side of the first connector, wherein the bracket is capable of receiving a device through the first receiving slot and allowing the device to be inserted in the first port from a direction that is substantially parallel to the bottom of the chassis.

3. The server enclosure as described in claim 2, wherein a second port is defined in a top of the second connector, wherein the bracket is capable of allowing a second device to be inserted in the second port from a direction that is substantially perpendicular to the bottom of the chassis.

4. The server enclosure as described in claim 3, further comprising of a bent plate extending from a top edge of the first sidewall of the mounting bracket and abutting the top of the printed circuit board; the bent plate defines an opening aligned with the second port of the second connector, the opening allows access for the second device to the second port through the opening.

5. The server enclosure as described in claim 1, wherein the printed circuit board has two securing holes, the bracket further comprises two securing posts that protruded from the first sidewall of the mounting bracket and align with the securing holes, the securing holes are capable of accepting fasteners to secure the transfer card to the mounting bracket.

6. The server enclosure as described in claim 1, wherein two positioning posts protrude from an inner side of the sidewall of the chassis, each positioning post has a narrow sliding portion and a wide blocking portion formed at a distal end of the sliding portion, two positioning slots are defined in the second sidewall of the mounting bracket, each positioning slot has a wide guiding portion for the blocking portion entering therethrough and a narrow securing portion communication with the blocking portion.

7. The server enclosure as described in claim 1, wherein a third connector is mounted on the printed circuit board on the side opposite of the first connector, the third connector is capable of electrically connecting the transfer card to a motherboard disposed on the bottom wall of the chassis.

8. The server enclosure as described in claim 1, wherein a second port is defined in a top of the second connector, wherein the bracket is capable of allowing a second device to be inserted in the second port from a direction that is substantially perpendicular to the bottom of the chassis.

9. A server enclosure with a transfer card module, comprising:
   a chassis having a bottom and a side perpendicular thereto;
   a mounting bracket attached to the side of the chassis, the mounting bracket defining a first receiving slot and a second receiving slot; and
   a transfer card having a printed circuit board secured to the mounting bracket, a first connector and a second connector disposed on one side of the printed circuit board, one end of the printed circuit board with the second connector being received in the second receiving slot, a first port defined in the first connector capable of receiving a device through the first receiving slot and allowing the device to be inserted in the first port from a direction that is substantially parallel to the bottom of the chassis.

10. The server enclosure as described in claim 9, wherein the thickness of the first connector is thicker than that of the second connector, the first port is defined in one side of the first connector towards to the second connector and is offset from the second connector.

11. The server enclosure as described in claim 10, wherein a second port is defined in a top of the second connector, the bracket is capable of allowing a second device to be inserted in the second port from a direction that is substantially perpendicular to the bottom of the chassis.

12. The server enclosure as described in claim 9, wherein the mounting bracket comprises:
   a first sidewall and an opposite second sidewall, which together define the first receiving slot; and
   a bent plate, having a horizontal wall and a vertical wall parallel to the first sidewall, extends from a top edge of the first sidewall of the mounting bracket;
   and wherein the second receiving slot is defined between the vertical wall and the first sidewall of the mounting bracket.

13. The server enclosure as described in claim 9, wherein the printed circuit board has two securing holes, the bracket further comprises two securing posts that protruded from the first sidewall of the mounting bracket and align with the securing holes, the securing holes are capable of accepting fasteners to secure the transfer card to the mounting bracket.

14. The server enclosure as described in claim 9, wherein two positioning posts protrude from an inner side of the side of the chassis, each positioning post has a narrow sliding portion and a wide blocking portion formed at a distal end of the sliding portion, two positioning slots are defined in the second sidewall of the mounting bracket, each positioning slot has a wide guiding portion for the blocking portion entering therethrough and a narrow securing portion communication with the blocking portion.

15. The server enclosure as described in claim 9, wherein a third connector is mounted on the printed circuit board on the side opposite of the first connector, and the third connector is capable of electrically connecting the transfer card to a motherboard disposed on the bottom of the chassis.

16. The server enclosure as described in claim 9, wherein the first connector is a universal serial bus connector.

17. The server enclosure as described in claim 9, wherein the second connector is a secure digital card connector.

* * * * *